United States Patent [19]
Dantlgraber

[11] Patent Number: 4,959,581
[45] Date of Patent: Sep. 25, 1990

[54] SERVO VALVE HAVING A PIEZOELECTRIC ELEMENT AS A CONTROL MOTOR

[75] Inventor: Jörg Dantlgraber, Lohr-Sackenbach, Fed. Rep. of Germany

[73] Assignee: Mannesmann Rexroth GmbH, Lohr, Fed. Rep. of Germany

[21] Appl. No.: 270,548

[22] Filed: Nov. 14, 1988

[30] Foreign Application Priority Data

Nov. 13, 1987 [DE] Fed. Rep. of Germany ....... 3738630

[51] Int. Cl.[5] .............................................. H01L 41/08

[52] U.S. Cl. .................................... 310/328; 310/330; 310/332; 137/625.61; 251/129.01; 239/585

[58] Field of Search ........................ 310/328, 330–332; 239/585; 251/129.01, 129.06; 137/831, 626.61

[56] References Cited

U.S. PATENT DOCUMENTS

| | | | |
|---|---|---|---|
| 3,050,034 | 8/1962 | Benton | 310/328 |
| 3,107,630 | 10/1963 | Johnson et al. | 310/332 X |
| 3,461,910 | 8/1969 | Selsam et al. | 310/328 X |
| 3,501,099 | 3/1970 | Benson | 310/328 X |
| 3,524,474 | 8/1970 | McCormick | 310/332 X |
| 4,011,474 | 3/1977 | O'Neill | 310/328 |
| 4,471,256 | 9/1984 | Igashira | 310/328 |
| 4,567,394 | 1/1986 | Frisch | 310/328 X |
| 4,690,465 | 9/1987 | Takeda et al. | 310/328 X |
| 4,771,204 | 9/1988 | Siegal | 310/332 X |
| 4,814,659 | 3/1989 | Sawada | 310/328 |

*Primary Examiner*—Mark O. Budd
*Attorney, Agent, or Firm*—Cushman, Darby & Cushman

[57] ABSTRACT

A control motor for a servo valve is provided. The control motor comprises a control element which can carry out a pivotal movement due to an electric input signal supplied to said motor. The movement of the control element causes a corresponding change of hydraulic resistances and, as a consequence, changes in hydraulic output signals of an hydraulic amplifier actuated by said motor.

28 Claims, 7 Drawing Sheets

SERVO VALVE HAVING A PIEZOELECTRIC ELEMENT AS A CONTROL MOTOR

1. Technical Field

This invention relates generally to an electro hydraulic pressure transducer, and more particularly, to a an electric control motor for a servo valve. Said control motor preferably having an hydraulic amplifier. The invention further relates to a servo valve using such an electric control motor.

2. Background Art

Servo valves are used in the field of hydraulics to a large extent and their purpose is the analog transformation of a small electrical input signal into a hydraulic output signal. Servo valves are frequently designed as having a plurality of stages, specifically two stages. For instance, a two-stage directional servo valve comprises mainly a first or pilot stage consisting of an electric control motor and an hydraulic amplifier, and a second or main stage. Frequently the electric control motor is designed as a so-called torque motor. For details, please see pages 149 to 153 of the book "The Hydraulic-Trainer" by A. Schmitt, published by G.L. Rexroth GmbH, Lohr/Main, West-Germany, 1981.

Instead of using the relatively expensive torque motors it had been suggested to use bimorph piezoelectric elements as electromechanical motors or transducers for the servo valves Said known control motors using a bimorph piezoelectric element have, similarly to the already known jet or orifice baffle plate pilot control motor (see FIG. 1 on page 149 of the above mentioned book), the disadvantage that only a small pressure yield up to a maximum of 60% of the input pressure is possible. Moreover, there is a constant flow of pilot fluid, specifically pilot oil, which causes large hydraulic losses. Moreover, there is a reaction or feed back effect of the jet of pilot oil impinging onto the piezoelectric element which acts as a baffle plate. Another disadvantage of the known control motor using constant jets is the fact that the dynamic response of the following stage is limited. The use of jets or nozzles further results in the danger that an accumulation of dirt occurs, i.e. the use of jets or orifices causes a sensibility with respect to dirt. Moreover, problems are created by the cavitation of the jet of control oil.

It is an object of the present invention to overcome the disadvantages of the prior art.

It is another object of the invention to provide an electrohydraulic pressure transducer apparatus and a control motor apparatus in a simple and cost effective manner.

In accordance with another object of the invention an electrohydraulic pressure transducer and a control motor, respectively, are to be provided such that a reactionary effect of the jet of pilot oil impinging onto the control element (preferably in the form of a piezoelectric element) of the control motor is avoided. This way the control effected by the control motor can be carried out with a higher degree of preciseness.

DISCLOSURE OF THE INVENTION

In an aspect of the present invention an electrohydraulic pressure transducer apparatus is provided which uses a control element. The control element is of plate-like design and its control function is carried out by the front face of the control element. Preferably, the control element is a piezoelectric element.

In accordance with another aspect of the present invention a control motor apparatus for a servo valve is provided having an electric input for supplying an electrical signal to said apparatus. The electrical signal causes a corresponding movement of a control element in a direction of movement. A pump port or inlet is provided for supplying a pressure medium. Preferably, two control ports are used for supplying a hydraulic signal having a size corresponding to the size of movement of the control element. Means are provided for creating a control function so as to produce hydraulic signals. Said means comprise control surfaces. On the control element a control surface movable therewith. The control surface is provided in a parallel relationship with respect to the direction of movement. Said movable control surface cooperates with a stationary control surface which is provided at a housing member, for instance a cover for said housing, so as to generate the control function.

BRIEF DESCRIPTION OF THE DRAWINGS

FIG. 9 shows the four variable control edges referred to by the same reference numerals R1 to R4 as in FIG. 8;

FIG. 1 discloses the first or pilot stage of a servo valve of the prior art. The pilot stage comprises in substance a control motor as well as a hydraulic amplifier. In a realization of the design shown in FIG. 1 a control element in the form of a bimorph piezoelectric element 1 is fixedly mounted in a frame 2. If an electrical voltage is applied the piezoelectric element 1 in a manner well known and therefore not shown, the element 1 will bend, i.e. move in the direction of arrow X (direction of movement). As a consequence, the spacings a and b, respectively, between a jet 3 and a jet 4, respectively, and the piezoelectric element 1 are changed and therefore the flow resistances formed between the jets 3 and 4 and element 1 are changed. This causes in cooperation with the constant jets (nozzles, orifices) 5 and 6 a change of the pressure at control ports A and B as is well known in the art. Moreover, the jets 5 and 6 are connected in a known manner with a pump 50 supplying pilot oil (pressure medium). Reference numeral 51 refers to a tank.

In FIGS. 2 through 7 a first embodiment of a pilot control stage 52 of a pilot valve is described. The pilot control 52 comprises a control motor 53 and a hydraulic amplifier 54 (FIG. 4). The pilot control stage 52 of the invention will be explained below by reference to FIGS. 2 through 7.

Figure 4:
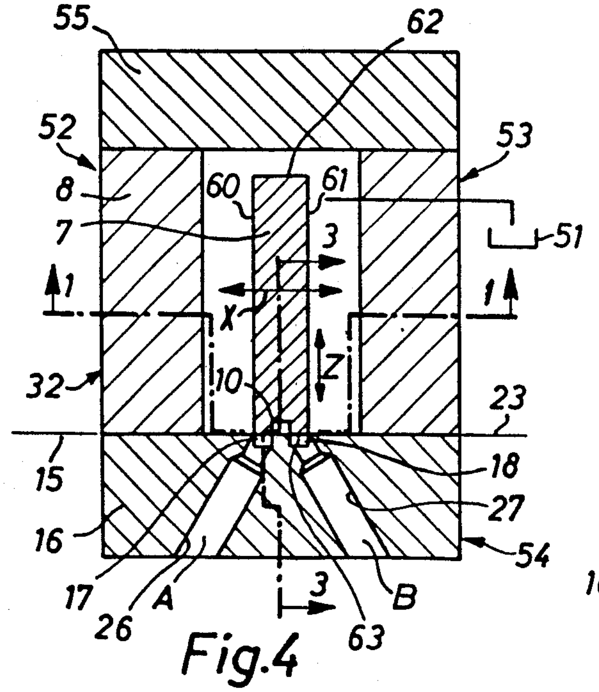
FIG. 4 is a sectional view taken along lines 4—4 in FIG. 2.
Figure 5:
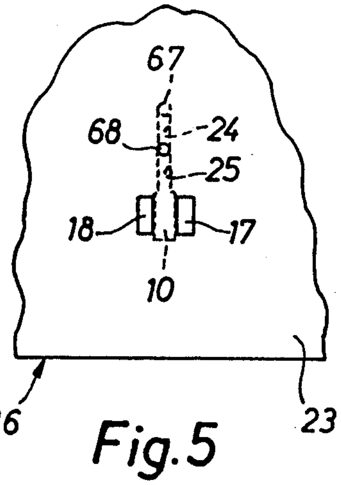
FIG. 5 is a partial plan view onto the cover of a housing not shown in FIG. 2, said cover being placed on a frame shown in FIG. 2.

So as to give an overview of the first embodiment it should be noted that FIG. 4 discloses the basic configuration of the pilot control stage 52. In the center of FIG. 4 a bimorph piezoelectric element 7 is shown which will be generally referred to as a control element. The piezoelectric element 7 is fixedly mounted in a frame 8 in a manner shown in FIG. 2. The frame 8 is covered on both sides by each one cover 16 and 55, respectively.

The frame 8 and the covers 16 and 55 form a housing 32 of the pilot control stage 52. Looking at FIG. 2 the cover 55 has to be contemplated as lying below the plane of paper, while the cover 16 is located on the plane of paper with the frame 18 being arranged between said covers 55 and 16. The cavity 28 formed by the frame 8 and the covers 16 and 55 is connected to tank 51 as is schematically shown in FIG. 4.

The piezoelectric element 7 is fixedly mounted with its one end between two arms 57, 58 of the frame 8 with the assistance of a fastening bolt 56. Arm 57 forms a recess 59 so that an adjustment screw 9 arranged in the manner shown will allow for an adjustment of the 0-position of the piezoelectric element 7 in the X-direction. This adjustment makes use of the elasticity of the areas 29 and 30 of the frame 8.

The piezoelectric element 7 has a generally plate like shape fixedly clamped at one end as described above. Due to the plate like a shape the piezoelectric element 7 comprises according to the embodiment of FIGS. 2 through 7 two broad sides 60 and 61, two narrow sides or front faces 62 and 63 and further an upper side (upper surface) 64 and a lower side (bottom surface) 65.

Figure 1:
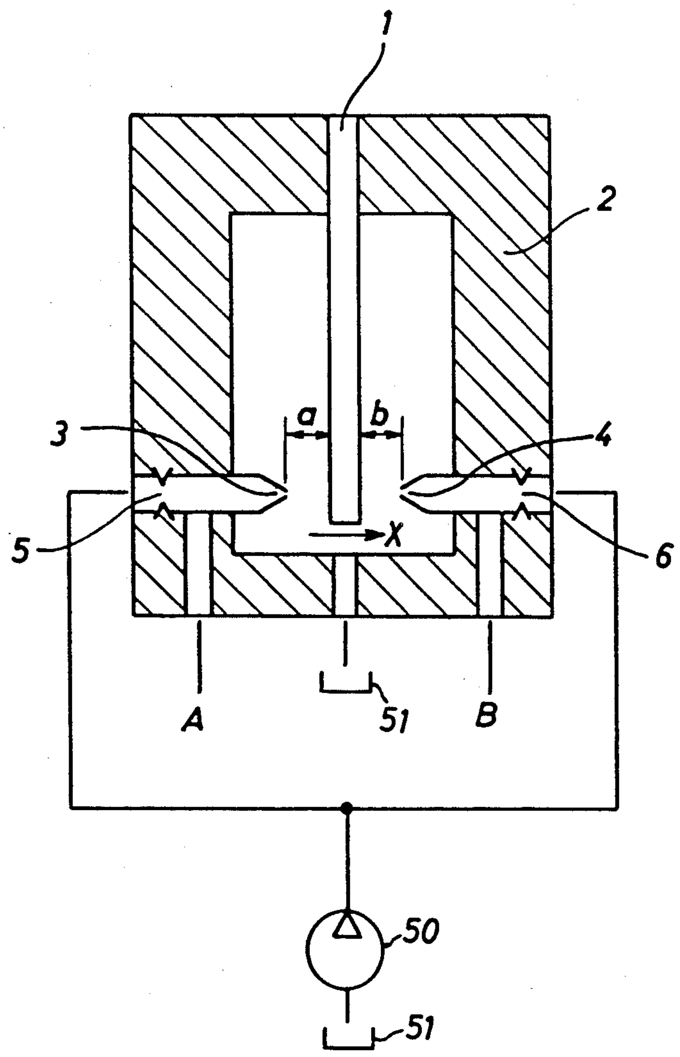
FIG. 1 is diagrammatic section of a prior art control motor having a hydraulic amplifier and acting as a first or pilot control stage of a servo valve.
Figure 2:
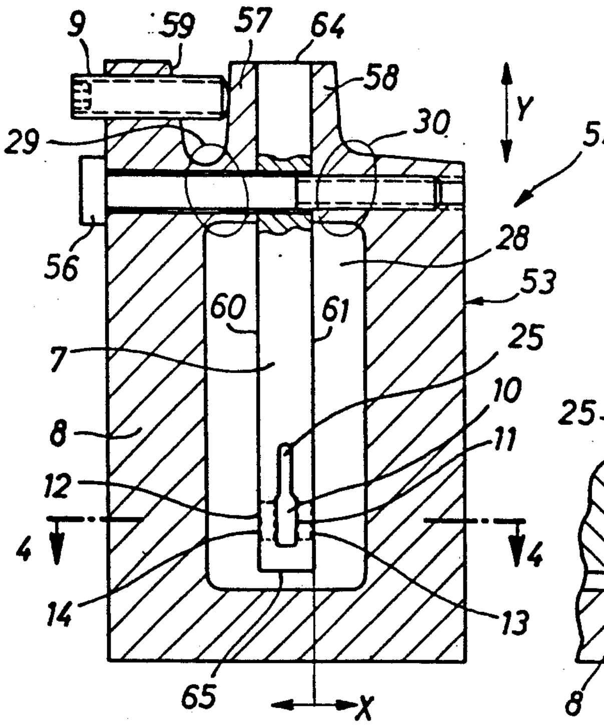
FIG. 2 is a sectional view taken along lines 1—1 in FIG. 4 showing a first embodiment of a control motor together with a hydraulic amplifier.

If one compares FIG. 2 with the prior art of FIG. 1 one realizes that the piezoelectric element 1 of the prior art also has a platelike shape. Further, the broad sides of element 1 which correspond to the broad sides 60 and 61 of FIG. 4 are used as the control surfaces (or control sides) inasmuch as they cooperate with the jets 3 and 4 to create the control function. The piezoelectric element 7 is energized by an input voltage similar to element 1 so as to cause a corresponding movement of the element 7 to control the hydraulic amplifier (control function of the element 7).

In accordance with the present invention the control function is generated by a front face or narrow side of the piezoelectric element 7. In the embodiment shown the front face 63, i.e. a laterally arranged narrow side, is used as a means for creating the control function, so as to generate hydraulic signals in the control ports A and B according to the movement of the piezoelectric element 7. This will be explained in more detail below.

The means for creating a control function comprise firstly in the piezoelectric element 7 a groovelike recess 10. This recess 10 is formed in the front face (control face) 63 preferably by the action of a laser or by means of etching. The recess 10 (see also FIG. 6) forms longitudinal edges 11 and 12 in a precise location with respect to each other and also with respect to longitudinal edges 13 and 14 of the piezoelectric element 7.

It is possible to provide the recess 10 together with the edges 11 and 12 as well as the longitudinal edges 13 and 14 in a separate element which is then fixedly mounted to the control element 7.

The frame 8 together with the clamped control element 7 is made perfectly plane with respect to the surface 15 of the cover 16 (see FIG. 4). This is preferably done by machining, preferably grinding in the Y-direction or by lapping.

The means for creating a control function secondly comprise two recesses 17 and 18 which are located in a control surface 23 of the cover 16. The recesses 17 and 18 have side edges 19, 20, 21 and 22 as can be seen best in FIGS. 6 and 7. The side edges 19 through 22 are in a defined relationship with the side edges 14, 12, 11 and 13 of the control element 7.

The control surface 23 of the cover 16 has a slightly concave form due to a grinding or lapping operation, so that between the control element 7 and the cover 8 a few micrometers of play provided.

The recess 25 is supplied with pressure medium, particularly hydraulic oil, by pump 50 (see FIG. 3) via a conduit 66 and a channel 24 in the cover 16. Inasmuch as the recess 10 is connected with the recess 25 the hydraulic oil having a pressure $P_p$ will be present in the recess 10.

The recesses 17 in 18 in the cover 16 are connected via channels 26 and 27, respectively, to the control port or user A and the control port or user B, respectively. For example, the users A and B are the two chambers of the main stage of a servo valve. Said chambers are located at opposite sides of the main spool (see for instance FIG. 4 on page 150 of the initially mentioned book "The Hydraulic Trainer").

Figure 6:
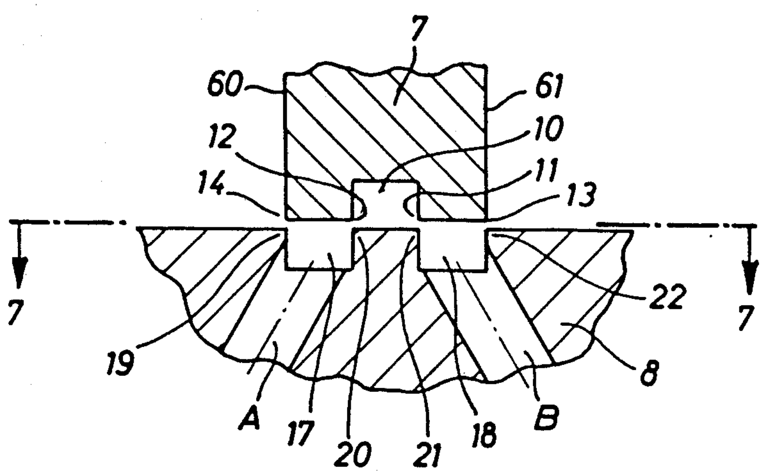
FIG. 6 is a detail of FIG. 4.

Initially, with no voltage applied to the piezoelectric element 7 the adjustment of the piezoelectric element 7 is carried out by rotating the adjustment screw 9. During this adjustment the elasticity of the areas 29 and 30 is made use of so as to arrange the recess 10 in symmetry with the recesses 17 and 18. The condition of O-adjustment is shown in FIG. 6 and also in FIG. 7. Indeed, in FIG. 7 the edges 14, 12, 11 and 13 shown in dashed lines should be in line with the corresponding edges 19, 20, 21 and 22. The edges 14, 12, 11 and 13 shown in dashed lines are offset with respect to the appropriate edges only to increase the legibility of the drawing.

Figure 3:
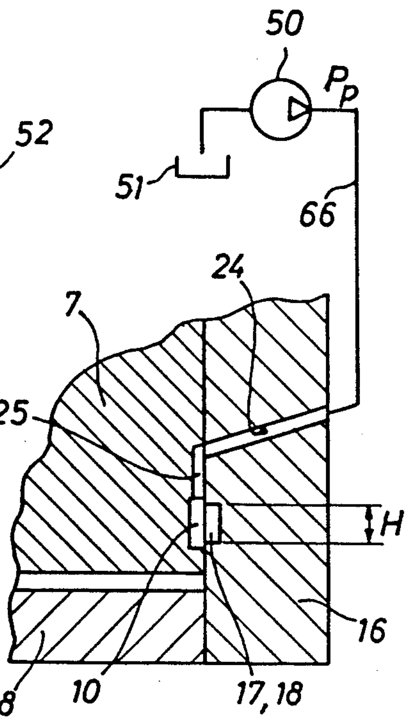
FIG. 3 is a partial sectional view taken along lines 3—3 in FIG. 4.
Figure 7:
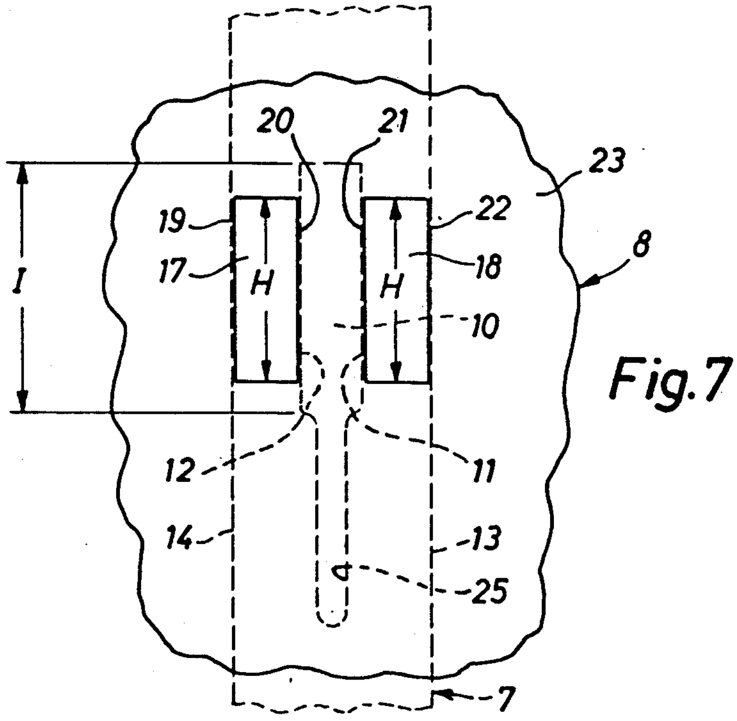
FIG. 7 is a view from line 7—7 in FIG. 6 towards the stationary control surface, with the contour of the movable control surface of FIG. 6 being shown by dashed lines.

In FIG. 7 it can be recognized that the two groove shaped recesses 17 and 18 have the same height H in vertical or Y-direction (see FIG. 3). The length of the groove shaped recess 10 in the element 7 is somewhat larger than the height H. The recess 10 extends on both sides beyond the recesses 17 and 18.

Due to the arrangement of the invention the flow resistances at the edges 12/20 and 11/21 are of the same size and, moreover the resistances at the edges 14/19 and 13/22 are equal. As a consequence, the pressures in the recesses 17 and 18 are the same in the position represented in FIGS. 6 and 7.

A voltage applied to the piezoelectric element 7 would cause a bending movement of the piezoelectric element 7 with the consequence of a movement in the X-direction. Due to this movement the four resistances 14/19, 12/20, 11/21 and 13/22 will change simultaneously and correspondingly the pressures in the recesses 17 and 18 and also the control ports A and B will be changed in a manner proportional to the voltage applied to the piezoelectric element 7.

Figure 8:
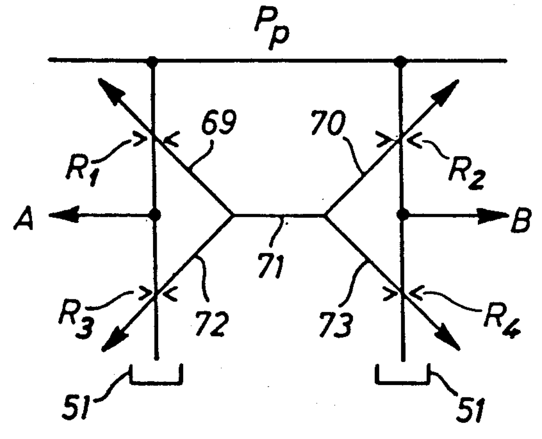
FIG. 8 is the circuit diagram of the first embodiment described in FIGS. 2 to 7.
Figure 9:
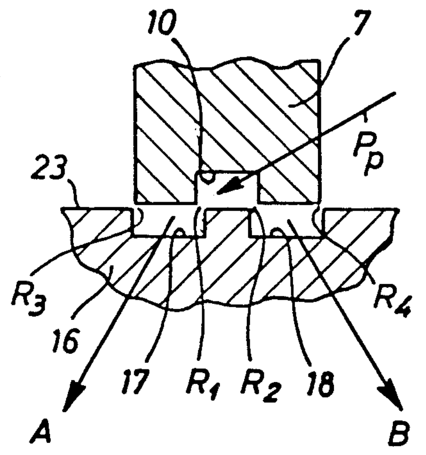
FIG. 9 is a practical realization of the circuit of FIG. 8, said realization being practically identical with the realization of FIG. 6, however

FIGS. 8 and 9 show a general representation of the embodiment of FIGS. 2 through 7. The respective resistances of 12/20 and 11/21 and 14/19 and 13/22 are referred to by R1, R2, R3 and R4. The connecting lines 69 through 73 in FIG. 8 indicate that the change of the resistances R1 through R4 occurs together.

By using, in accordance with the invention, four variable resistances R1 to R4, the pressure yield becomes greater than 90%. For the same reason the constant pilot oil stream becomes smaller. Inasmuch as the element 7 is much more stable in Z-direction than in X-direction, the hydraulic reaction or feedback is small, because the force created by the pressure of the pressure medium acts in Z-direction. Inasmuch as the embodiment of FIGS. 2 through 7 (and also of FIGS. 8 and 9) does not use constant jets (orifices) the maximum throughput of the pressure medium is larger and consequently the dynamics of the following stages is higher. Moreover, the invention provides for a smaller sensitivity with respect to dirt. Also, no cavitation and a simpler mechanical design is achieved with simple machining operations.

Figure 10:
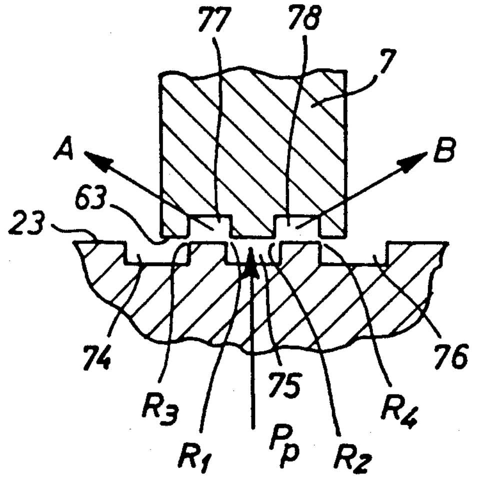
FIG. 10 shows schematically a second embodiment of the invention in a representation similar to FIG. 9 where again four variable control edges are realized as was shown in FIG. 8.

FIG. 10 discloses another realization of the circuit of FIG. 8. In accordance with FIG. 10 in the control surface of the piezoelectric element 7 two recesses 77 and 78 are provided which are suitably connected with the control ports A and B simply shown here by arrows. Moreover, the control surface 23 of the cover 16 comprises three recesses 74, 75, 76 which extend parallel to each other. Of said recesses the recesses 74 and 76 are connected to the tank while the recess 75 is connected with the pilot oil pump 50 in a manner not shown in detail but referred to by arrow $P_p$ in FIG. 10. The resistances R1 to R4 are formed by pairs of edges which are correspondingly referred to. The design of FIG. 10 also shows advantages with respect to the prior art but requires higher machining costs than the design of FIG. 9.

Figure 11:
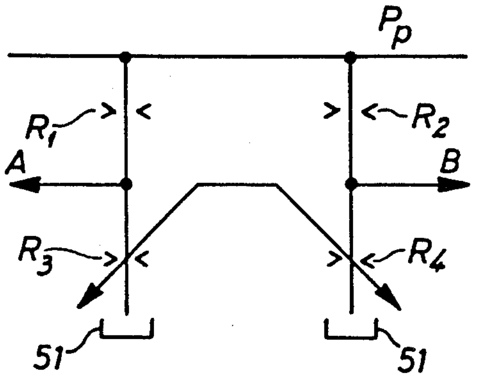
FIG. 11 is a general circuit diagram for a control motor having two variable control edges and two fixed throttles or orifices.

FIG. 11 shows a circuit similar to FIG. 8. However in FIG. 11 two variable control edges form two variable hydraulic resistances 3 and 4 and moreover two fixed jets or orifices form the resistances R1 and R2. $P_p$ again refers to the pressure supplied by the pilot oil pump 50. A and B are again the control ports and the tank is referred to by reference numeral 51.

Figure 12:
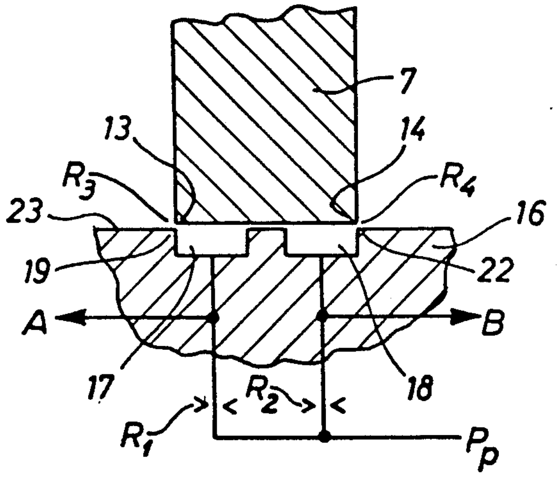
FIG. 12 is a schematic representation of a first realization of the circuit of FIG. 11.

FIG. 12 shows a first realization of the circuit of FIG. 11. The piezoelectric element 7 is without any recesses. Only control edges 13 and 14 are formed by element 7 which will cooperate with control edges 19 and 20 which in turn are formed by recesses 17 and 18 in the cover 16 so as to define the resistances R3 and R4. The recesses 17 and 18 are provided in the control surface 23 of the cover 16. The recesses 17 and 18 are connected via a jet or orifice R1 and a jet or orifice R2, respectively, to a conduit which leads to a pump which in turn supplies pilot oil with a pilot oil pressure $P_p$. Between the recess 17 and the fixed or nonadjustable orifice R1 the control port A is provided and between the recess 18 and the fixed or nonadjustable orifice R2 the control port B is provided. The operation of the apparatus of FIG. 12 should be clear to a man skilled in the art based on what was said about the embodiment of FIG. 6.

Figure 13:
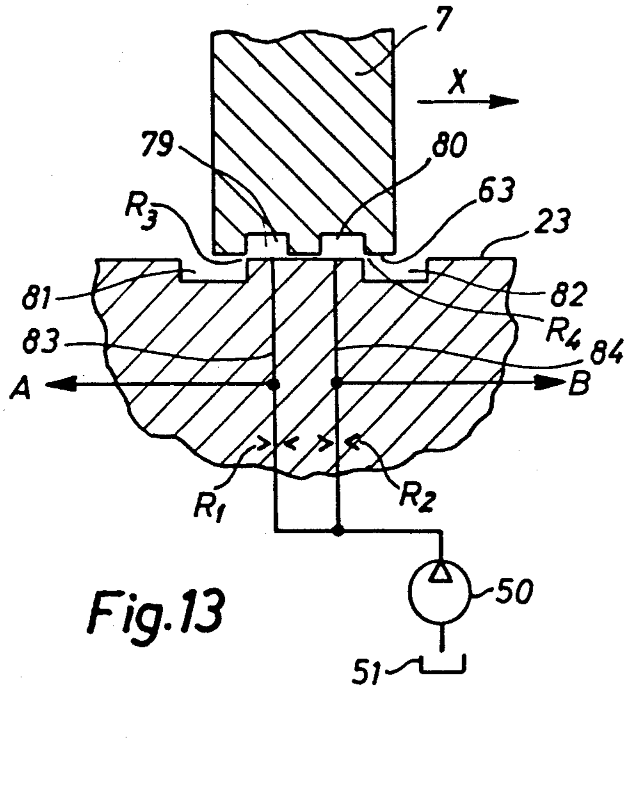
FIG. 13 is a schematic representation of a second realization of the circuit of FIG. 11.

FIG. 13 discloses another realization of the circuit of FIG. 11. This realization is somewhat more costly than the realization of FIG. 12. The embodiment of FIG. 13 provides for two recesses 79 and 80 in the control surface 63 of the piezoelectric element 7. Said recesses 79 and 80 cooperate with recesses 81 and 82 in the control surface 23 of the cover 16 to define variable resistances R3 and R4, respectively. The recesses 81, 82 are connected to the (not shown) tank. The cover 16 is provided with channels 83 and 84 which end in the area of the recesses 79 and 80. The channel 82 is connected with the control port A and the channel 84 is connected with the control port B. Moreover, a fixed jet or orifice R1 is connected with the channel 83 and a fixed or nonadjustable orifice R2 is connected with the channel 84. Moreover, fixed or nonadjustable orifices (jets) form R1 and R2 and are connected to a hydraulic pump 50 which supplies pressure medium with a pressure $P_p$.

When the piezoelectric element 7 is in its position shown in FIG. 13, with the recesses 79 and 80 being located symmetrically with respect to the recesses 81 and 82, the same pressures will occur at the control ports A and B because the resistances R3 and R4 are the same, and also the resistances R1 and R2 are the same. When the piezoelectric element (generally the control element) 7 is moved or pivoted in the X-direction, then the resistances R3 and R4 are changed and a corresponding change of the pressures in the control ports A and B is the consequence.

Figure 14:
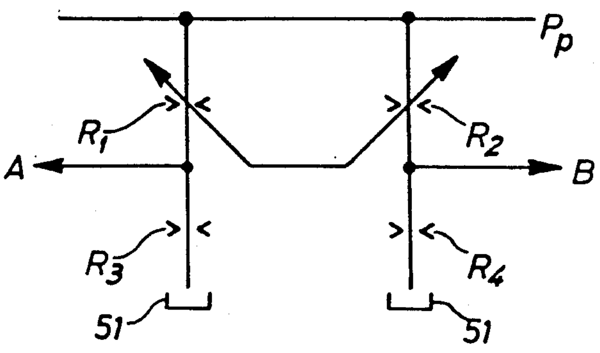
FIG. 14 is the third possible circuit arrangement of a control motor similar to the circuit of FIG. 11 and using two variable control edges and two fixed nozzles or orifices.
Figure 15:
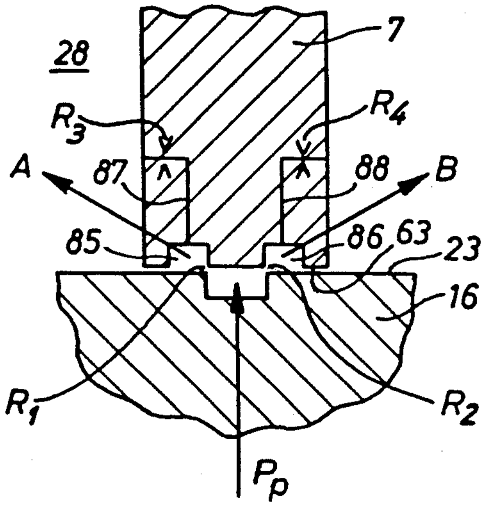
FIG. 15 is a first realization of the circuit of FIG. 14.
Figure 16:
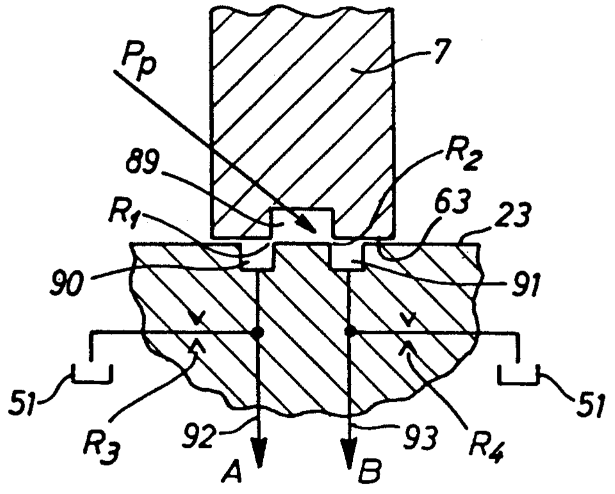
FIG. 16 is a second realization of the circuit of FIG. 14.

FIG. 14 discloses another circuit using two variable control edges forming the resistances R1 and R2 and two nonadjustable or fixed orifices which form the resistances R3 and R4. $P_p$ refers again to the pressure supplied from a pump for pilot oil. The control ports are again referred to by A and B. FIGS. 15 and 16 disclose two realizations of the circuit of FIG. 14.

In FIG. 15 the front face 63 of the piezoelectric element 7 is provided with tow recesses 85, 86 which are connected in a suitable manner (not shown) with the control ports A and B (please see the arrows). Moreover, the recess 85 is connected via a channel 87 with a fixed orifice R3, and the recess 86 is connected via a channel 88 with a fixed orifice R4. A cavity 28 surrounding the piezoelectric element is connected to a tank 51 similar to what is shown in FIG. 4.

FIG. 16 is a different realization of the circuit of FIG. 14. According to this embodiment the piezoelectric element 7 is provided with a recess 89 connected to a hydraulic pump for supplying pressure medium having the pressure $P_p$. The recess 89 forms with its longitudinal edges together with the longitudinal edges of recesses 90, 91 in the control surface 23 resistances R1 and R2 which are variable when the element 7 is moved. The recess 90 is connected via a conduit 92 in the cover to a control port A, and further, the conduit 92 is connected via a fixed orifice R3 with the tank 51. The recess 91 is connected via a conduit 93 with the control port B, and the recess is moreover connected via a fixed orifice R4 to tank 51. The function of the apparatus of FIG. 16 should be clear to a man skilled in the art based on what was described so far.

Figure 17:
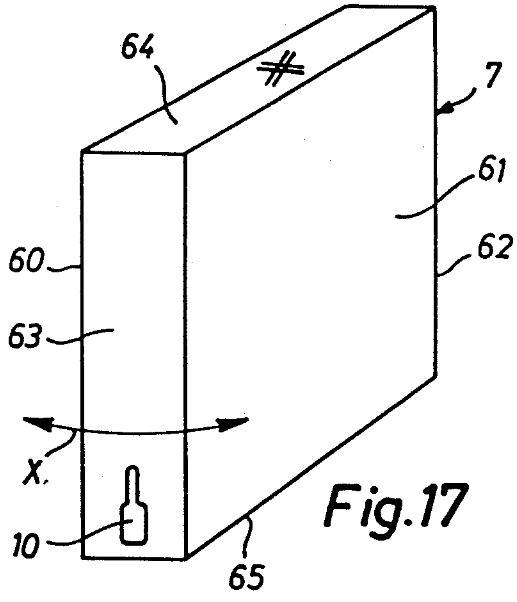
FIG. 17 is a schematic representation of a form of the control element of a control motor as well as of the position of its control surface.
Figure 21:
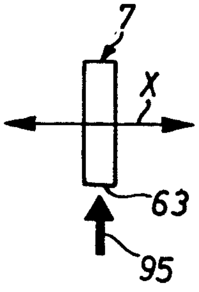
FIG. 21 is a schematic representation of a control element as well as the position of the control surface of said control element with respect to the direction of movement of the control element.

FIGS. 17 and 21 are intended to provide some general explanations of the invention. FIG. 17 is a diagrammatic representation of a piezoelectric element 7 of the type used for instance in the embodiment of FIGS. 2 through 7. Shown are the two broad sides 60 and 61 and the two lateral narrow sides or front faces 62 and 63. Moreover, the upper surface 64 and the bottom surface 65 is shown. The piezoelectric element 7 is fixedly clamped for instance to a frame in the area of the upper surface 64. It can be readily recognized that the lateral front face or surface 63 acts as a control surface because there the recess 10 is shown. The arrow X relates to the direction of movement of the piezoelectric element 7.

Figure 18:
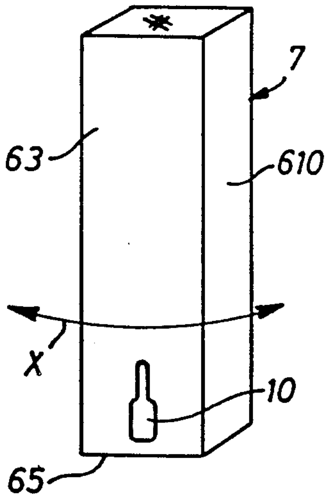
FIG. 18 is another representation of a control element as well as the position of its control surface.

FIG. 18 discloses a less preferred modification of the piezoelectric element 7 of FIG. 17. Again, the direction of movement of the element 7 is referred to by arrow X. The front face 6 again forms the control surface, for effecting the control function. Reference 610 in FIG. 18 refers to a face similar to broad side 61 of FIG. 17. In contrast to the preferred embodiment of FIGS. 2 through 7 the moment of resistance of the piezoelectric element 7 in the direction of the action of the force created by the fluid pressure is small with the consequence of bending effect depending on the pressure. This leads to an increased leakage. For that reason the embodiment of FIG. 18 is not preferred. In contrast thereto, according to the preferred embodiment of the invention the moment of resistance of the piezoelectric element 7 should be large in the direction in which the force created by the fluid pressure acts. Again, the piezoelectric element 7 of FIG. 18 is fixedly clamped in the area of its upper end.

Figure 19:
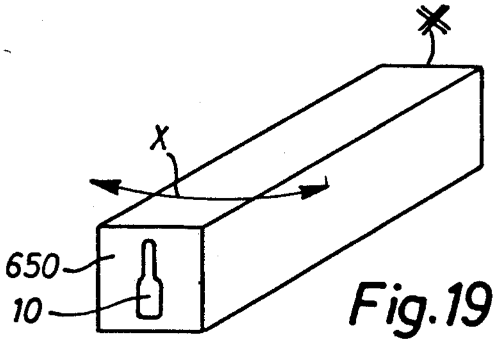
FIG. 19 is another representation of the control element as well as the position of its control surface.

FIG. 19 discloses the possibility that the bottom side 65 of the piezoelectric element 7 of FIG. 17 is used as the control surface. In FIG. 19 the bottom side acts as control surface and is referred to by reference numeral 615.

From the above discussion of FIGS. 17 through 19 it can be recognized that the advantage of no or only a small feedback of the control surface to the movement of the piezoelectric element 7 is achieved when the control surface extends more or less parallel to the direction of movement X of the piezoelectric element 7.

Figure 20:
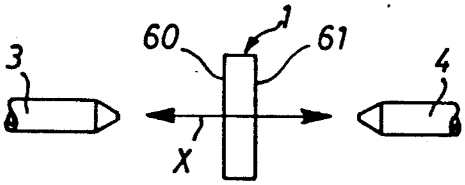
FIG. 20 is a schematic representation of the position of the control surfaces of a control element with respect to the directions of movement of the control element according to the prior art.

FIG. 20 shows schematically again the principle of the prior art (see also FIG. 1) where the broad sides 60 and 61 form the control surfaces which extend with respect to the direction of movement X substantially perpendicularly. In contrast thereto, FIG. 21 shows the piezoelectric element 7 and its direction of movement X. The arrow 95 in FIG. 21 is supposed to show that the control function, i.e. the flow of pilot oil occurs between control surface 63 of the piezoelectric element, with the control surface 63 extending substantially parallel to the direction of movement X.

In the preferred embodiment a piezoelectric element 7 is used as a control element. However, it is also possible to use instead of a piezoelectric element generally a control element which can be caused to move or pivot by different means but carries out the control function in a similar manner to the piezoelectric element 7. For instance, the control element could be moved or pivoted by magnetic forces. Said magnetic forces could be generated by an electromagnet which in turn is energized by a control input current.

Summarizing it can be said that the present invention realizes the control function required for the pilot stage 52 by using movable control means in the form of a control element 7 and by nonmovable or stationary control means in the form of a component which is fixed to a housing, for instance the cover 16 of a housing. The basic contribution of the present invention is the recognition that the movable control means are provided with a control surface which is movable together with said control means, and said movable control surface cooperates with a stationary control surface preferably by forming control edges therewith. The direction of movement X of the movable control surface occurs substantially parallel to said stationary control surface. Preferably the control edges of the movable control surface as well as in the stationary control surface are formed by one or more control openings or recesses. Two control edges are formed by the lateral borders of the control element. The two control surfaces, the stationary and the movable control surfaces extend substantially parallel to each other and are narrowly spaced from each other.

I claim:

1. An electrohydraulic pressure transducer apparatus comprising:
   - a control element comprising a piezoelectric element,
   - electrically actuated means for causing a movement of said control element for carrying out a control function so as to change a hydraulic output signal in accordance with an electric input signal, wherein
   - the control function is provided for by a front face of said control element, the moment of resistance of the control element is small in the direction of movement of the control element, but large in the direction in which the force created by the pressure of the hydraulic output signal acts, the front face of the control element has a recess defined therein which is connected with a source of pressure medium, and said recess is connected with stationary recesses which are connected with control ports in the housing or cover of the apparatus.

2. The apparatus of claim 1 wherein the surfaces of the control element and of the stationary housing or cover, respectively, which are provided with said recesses have a small distance providing for a throttling gap.

3. A control apparatus in cooperation with a hydraulic amplifier, said apparatus comprising:
   - a housing having a pump port, a tank port and at least two control ports,
   - a frame,
   - a control element fixedly mounted in said frame in such a manner that the application of a small electrical input signal to said control element will cause a proportional movement of said control element in a direction of movement,
   - wherein said control element forms one or a plurality of control surfaces, means for creating a control function together with the control surface(s) of the control element so as to generate hydraulic output signals at said control ports which correspond to said movement of the control element, and wherein one control surface is provided at the control element in substance parallel to the direction of movement such that the control function cannot create a force component in or opposite to the direction of movement inasmuch as the force components act substantially perpendicular to the direction of movement;

wherein only one control surface is provided at the control element and only one control surface is provided at a component which is stationary with respect to the housing, said stationary component being located adjacent to said first control surface;

wherein the control element fixedly mounted to said frame can be adjusted with respect to its 0- or initial position, wherein the adjustment of the 0- position of the control element being effected by means of a screw using the resilient regions of the frame to transfer an adjustment force onto the control element.

4. The apparatus of claim 3, wherein the control element is a piezoelectric element terms a control element.

5. The apparatus of claim 3 wherein four movable control edges and four stationary control edges are provided so as to form four variable hydraulic resistances.

6. The apparatus of claim 5, wherein the control element comprises a recess and the stationary component comprises two recesses so as to realize four variable resistances.

7. The apparatus of claim 3 wherein the control element comprises two recesses and a stationary component cover comprises three recesses so as to form four variable resistances.

8. The apparatus of claim 3 wherein the movable control surface and the stationary control surface each form two control edges so as to define two variable resistances and wherein further two fixed orifices are provided for forming resistances.

9. The apparatus of claim 3 wherein the control element forms two control edges and the stationary control surface forms two control edges by means of two recesses, said control edges cooperating for forming resistances.

10. The apparatus of claim 3 wherein the control surface of the control element comprises two recesses which cooperate with two recesses provided in the stationary control surface so as to form two variable resistances, and wherein further two fixed orifices are provided.

11. The apparatus of claim 3 wherein two variable resistances are provided which are supplied with pressure, said resistances being connected via fixed orifices to tank, wherein between said resistances the control port is located, while between the resistances the control port is located.

12. The apparatus of claim 3 wherein the control surface of the control element (7) comprises two recesses, each of said recesses being connected via fixed orifices with the tank, said recesses further form two control edges which cooperate with the control edges provided by a recess in the stationary control surface, said control edges forming two variable resistances.

13. The apparatus of claim 3 wherein the control surface of the control element is provided with a recess defining two control edges, said control edges cooperate with two additional control edges formed by recesses in the stationary control surface so as to define resistances, and wherein the recess (90) is connected via a fixed orifice to tank, while the recess (91) is connected via a fixed orifice to the tank, and wherein further the control ports are connected with respective recesses.

14. The apparatus of claim 3 wherein a housing is provided which is formed by a cover forming a control surface, another cover, and a frame located and mounted between said covers, wherein said control element is fixedly mounted with its one end at said frame.

15. The apparatus of claim 14 wherein the movable control surface of the control element is movable in a substantially parallel direction with respect to the stationary control surface provided in a cover.

16. The apparatus of claim 15 wherein the control surface is provided with a recess for forming the control edges and that a hydraulic pump is connected with said recess.

17. The apparatus of claim 16 wherein the hydraulic pump supplies the pressure medium to the recess in the control surface of the control element via a recess in the control element, and a channel in the housing, for instance the cover.

18. The apparatus of claim 17 wherein said recesses in said stationary control surface of the housing, preferably the cover, are connected with channels in the cover, said channels leading to control ports.

19. The apparatus of claim 18 wherein said recesses are substantially groove shaped and form longitudinal edges.

20. The apparatus of claim 19 wherein said recess has in vertical direction on both sides a somewhat larger extension than the appropriate groove like recesses in the cover.

21. An electrohydraulic pressure transducer apparatus comprising:

a control element, electrically actuated means for causing a movement of said control element for carrying out a control function so as to change a hydraulic output signal in accordance with an electric input signal, wherein the control function is provided for by a front face of said control element, the moment of resistance of the control element is small in the direction of movement of the control element, but large in the direction in which the force created by the pressure of the hydraulic output signal acts, and a housing or cover of the apparatus has at least one recess defined therein substantially in facing relation to said front face of said control element, said at least one recess being connected to at least one of a source of pressure medium, tank, and a control port.

22. The apparatus of claim 21, wherein one of said recesses defined in said housing or cover is connected to a source of pressure medium.

23. An apparatus as in claim 21, wherein at least two recesses are defined in said housing or cover, two of said recesses being connected to tank.

24. An apparatus as in claim 21, wherein a front face of said control element has at least one recess defined therein, said at least one recess in said front fact being connected to at least one of a source of pressure medium, tank and a control port.

25. An apparatus as in claim 24, wherein two recesses are defined in said front face of said control element, each said recess being connected with a control port.

26. An apparatus as in claim 25, wherein three recesses are defined in said housing or cover, two of said recesses being connected to tank and one of said recesses being connected to a source of pressure medium.

27. An apparatus as in claim 21, wherein two recesses are defined in said housing or cover, each said recess being connected to a source of pressure medium and to a control port.

28. An apparatus as in claim 21 wherein first and second recesses are defined in the front face of said control element and first and second recesses are defined in said housing or cover, said recesses of said housing or cover being connected to tank, said housing or cover further having first and second channels defined therein each of which are disposed in facing relation to a said recess in said front face of said control element, each said channel being connected with a control port and to a common source of pressure medium.

* * * * *